United States Patent
Yamaguchi et al.

[11] Patent Number: 5,930,695
[45] Date of Patent: *Jul. 27, 1999

[54] RADIO RECEIVER WITH AMPLITUDE LIMITER PRIOR TO MIXER AND BAND LIMITING FILTER

[75] Inventors: Tsutomu Yamaguchi; Fuminori Itukaiti; Kazutoshi Higuchi, all of Yokohama; Jun'ichi Nakagawa, Tokorozawa, all of Japan

[73] Assignee: Hitachi, Ltd., Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/566,113

[22] Filed: Dec. 1, 1995

[30] Foreign Application Priority Data

Dec. 5, 1994 [JP] Japan .................................. 6-300531

[51] Int. Cl.$^6$ ...................................................... H04B 1/10
[52] U.S. Cl. ......................... 455/308; 455/217; 455/314
[58] Field of Search ................................ 455/232.1, 254, 455/308, 310, 311, 317, 210, 217, 309, 314, 296; 375/346

[56] References Cited

U.S. PATENT DOCUMENTS

| | | |
|---|---|---|
| 3,875,571 | 4/1975 | Davis, Jr. et al. . |
| 4,013,964 | 3/1977 | Skutta . |
| 4,045,731 | 8/1977 | Tokunou et al. ..................... 324/76.68 |
| 4,185,243 | 1/1980 | Brown ...................... 455/210 |
| 4,328,548 | 5/1982 | Crow et al. .............................. 364/449 |
| 4,439,769 | 3/1984 | Masak ................... 455/278.1 |
| 4,618,999 | 10/1986 | Watkinson ............................... 455/126 |
| 4,748,682 | 5/1988 | Fukae et al. .......................... 455/276.1 |
| 4,806,932 | 2/1989 | Bechtel ...................................... 342/33 |
| 4,937,580 | 6/1990 | Wills . |
| 5,058,200 | 10/1991 | Huang et al. ........................... 455/67.1 |
| 5,241,967 | 9/1993 | Yasushi et al. ......................... 128/732 |

FOREIGN PATENT DOCUMENTS 61-222326  10/1986  Japan .

*Primary Examiner*—Nguyen Vo
*Attorney, Agent, or Firm*—Antonelli, Terry, Stout & Kraus, LLP

[57] ABSTRACT

A radio receiver is disclosed. An arbitrary receive signal received through an antenna is amplified by an input amplifier. The signal amplified by the input amplifier is converted into a predetermined frequency by a mixer. The signal frequency-converted by the mixer is shaped in waveform by a band-limiting filter. The signal thus shaped in waveform is amplified and amplitude-limited by a limiting amplifier. The signal limited in amplitude is demodulated by a demodulator. In order to prevent the mixer circuit from generating a distortion due to an excessive input, another amplitude-limiting circuit operated at a level not saturating the mixer circuit is arranged in a stage before the mixer circuit.

12 Claims, 8 Drawing Sheets

RADIO RECEIVER WITH AMPLITUDE LIMITER PRIOR TO MIXER AND BAND LIMITING FILTER

BACKGROUND OF THE INVENTION

The present invention relates to radio receiver used for mobile radio communications, or more in particular to a radio receiver such as a digital radio receiver or an FM receiver with delayed detection type using a limiter amplifier.

FIG. 1 is a block diagram showing a receiving section of a conventional digital radio transceiver. A signal input from an antenna 1 is amplified by a low-noise amplifier 2, and after the unrequited signal components are removed by a bandpass filter 3, the resultant signals are frequency converted into a first intermediate frequency band by a first mixer 4. Only the required signal is selected by a bandpass filter 5, and after being frequency-converted into a second intermediate frequency by a second mixer 7, is waveformshaped by a roll-off filter 8. The resulting signal provided from the filter 8 is amplified by a second intermediate frequency amplifier 9 and demodulated by a demodulator 10.

Now, the problem points of the receiver shown in FIG. 1 will be explained in detail. When the signal level received by the antenna 1 increases, the signal in the second intermediate frequency amplifier 9 including several stages of limiter amplifiers begins to be limited in amplitude by a last limiter amplifier stage. With the increase in the receiving level, the signal in the second intermediate frequency amplifier 9 is limited in amplitude by each limiter amplifier stage progressively toward the preceding stages from the last stage. A receiving level where all the limiter amplifiers making up the second intermediate frequency amplifier 9 limit the signal in amplitude is assumed to be $P_0$, and a receiving level where the output of the second mixer 7 is saturated is assumed to be $P_1$. Generally, level $P_1$ is set larger than $P_0$. Therefore, when the receiving level reaches $P_1$, the second mixer 7 preceeding the roll-off filter 8 begins to be saturated, then a transmission distortion occurs thereby deteriorating a bit error rate. FIG. 3 shows an example of bit error rate characteristic against the receiving level of the receiver of FIG. 1. Also, FIG. 4 shows an example of the output characteristics of the second mixer 7 with respect to the receiving level. In the case where the receiving level is more than level $P_1$, as shown in FIG. 4, the output signal of the second mixer 7 beings to be distorted by saturation, and the bit error rate is rapidly deteriorated as shown in FIG. 3. This phenomenon frequently occurs when the transmitter and the receiver are closely located to each other as when portable radio transceivers are in proximity to each other or to a base station, and deteriorates the transmission quality of radio communications.

A method known to obviate the above-mentioned problem is to increase the current consumption of the second mixer 7 or to increase the power supply voltage. The second mixer 7 and the second intermediate frequency amplifier 9, however, are generally supplied as integrated circuits such as seen in Phillips' SA626 or Motorola's MC13156 available on the market. The use of these integrated circuits cannot change the DC bias of the second mixer 7.

Several other methods for solving these problems are publicly known. A representative case is disclosed in JP-A-61-222326 entitled "Receiver". This publication concerns a system comprising a variable attenuator inserted between the bandpass filter 5 and the second mixer 7 of the receiver shown in FIG. 1 and the attenuation amount of the variable attenuator is controlled in accordance with the receiving level. FIG. 2 is a block diagram showing the configuration of a receiver according to this publication. In FIG. 2, the component parts having the same functions as the receiver shown in FIG. 1 are denoted by the same reference numerals respectively. The difference between the system of FIG. 1 and the prior art will be described below.

In the published system, a variable attenuator 11 is interposed between the bandpass filter and the second mixer 7. The output of the bandpass filter 8 is applied to a second intermediate frequency amplifier 9 on the one hand, while a part of the signal is amplified by an amplifier 12 and applied to a detector 13 to detect the receiving level. The variable attenuator 11 is controlled in such a manner as to reduce the attenuation amount when the receiving level is low and to increase the attenuation amount when the receiving level is high, in accordance with the receiving level detected by the detector 13. Another part of the output of the bandpass filter 8 is applied to an interference detector 14 for interference detection. As described above, the signal distortion occured in the mixer 7 can be lowered up to a high receiving level by controlling the variable attenuator 11.

A variable gain amplifier may be used in place of the variable attenuator 11 as a means for solving the problem, similar to that presented by FIG. 2.

As described above, a receiver as shown in FIG. 1 poses the problem of the bit error rate deterioration due to the distortion of the second mixer 7 when the receiving level is excessively high. The problem is especially conspicuous when integrated circuits available on the market are used. Also, in the case where a receiver as shown in FIG. 2 is used for mobile radio communications, an abrupt change in electric field intensity due to fading or the like poses the problem of the attenuator control being unable to follow the change. Further, the amplifier 12 and the detector 13 are required to drive the variable attenuator 11, thereby leading to the problem of complicating the circuit configuration.

SUMMARY OF THE INVENTION

In view of the above-mentioned problems, the object of the the present invention is to provide a receiver simple in circuit configuration which can maintain a satisfactory bit error rate without any special control even when the receiving level is very large.

According to the present invention, in order to solve the above-mentioned problems, there is provided a receiver comprising an antenna, an input amplifier for amplifying an arbitrary receive signal received through the antenna, a mixer for converting a signal amplified by the input amplifier into a predetermined frequency, a band-limiting filter for shaping the waveform of the signal converted in frequency by the mixer, and a demodulator for demodulating the signal shaped in waveform by the band-limiting filter, in which an amplitude-limiting means adapted to operate at a level not saturating a circuit arranged between the antenna and the band-limiting filter is inserted before the particular circuit in order to prevent the circuit from generating a distortion due to an excessive input. As an example, an intermediate frequency amplifier 6 having the amplitude-limiting function which linearly amplifies until immediately before saturation of the second mixer 7 and produces no output more than a level saturating the second mixer 7 is inserted in the first intermediate frequency stage between the first mixer 4 and the second mixer 7 as shown in FIG. 6.

More specifically, in the event that the output of a given circuit in a radio receiver, is saturated due to an excessive input (that is a circuit inserted before band limiting by a roll-off filter or the like), the amplitude into the given circuit is limited in order to prevent the saturation of the circuit whereby the transmission distortion or the like in the circuit is reduced, thereby reducing the bit error rate of the radio receiver. For example, the input to the second mixer 7 is limited by inserting the intermediate frequency amplifier 6 in the stage before the second mixer 7, whereby the distortion of the second mixer 7 is suppressed at all receiving levels (including an excessive input), and therefore the bit error rate characteristic can be improved when the receiving level is excessively large.

In conventional receiving demodulation systems using a roll-off filter, a limiter amplifier and a delayed detector, the non-linear operation such as that of a limiter (for amplitude limitation) in a stage before a roll-off filter deteriorates the error rate characteristic. In view of this, the non-linear operation like the one according to the invention has not been practiced. As obvious from the result shown in FIG. 11 described later, however, the deterioration due to the non-linear operation is very small when a limiting function in a stage before a roll-off filter where the receiving signal level is enough high, that is, where the signal-to-noise ratio is enough high, and therefore the error rate characteristic required of the radio receiver as a whole can be satisfied.

DESCRIPTION OF THE PREFERRED EMBODIMENTS

The present invention will be described below with reference to embodiments.

Figure 5:
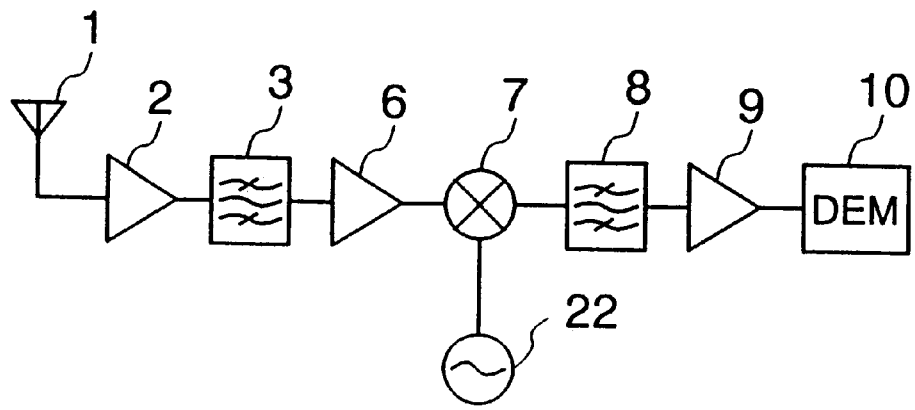
FIG. 5 is a block diagram showing a receiver circuit according to the present invention.

FIG. 5 shows a single superheterodyne receiver constituting a digital radio receiver. In FIG. 5, the signal received by an antenna 1 are amplified by a low-noise amplifier 2. After the undesired components are removed by a bandpass filter 3, the resultant signal is applied to a mixer 7 through an amplifier 6 having the amplitude-limiting function, converted into an intermediate frequency by being multiplied with a local-oscillation signal 22, when the frequency-corrected signal is shaped in waveform by a roll-off filter 8, amplified by a limiter amplifier 9, and demodulated by a demodulator.

Figure 6:
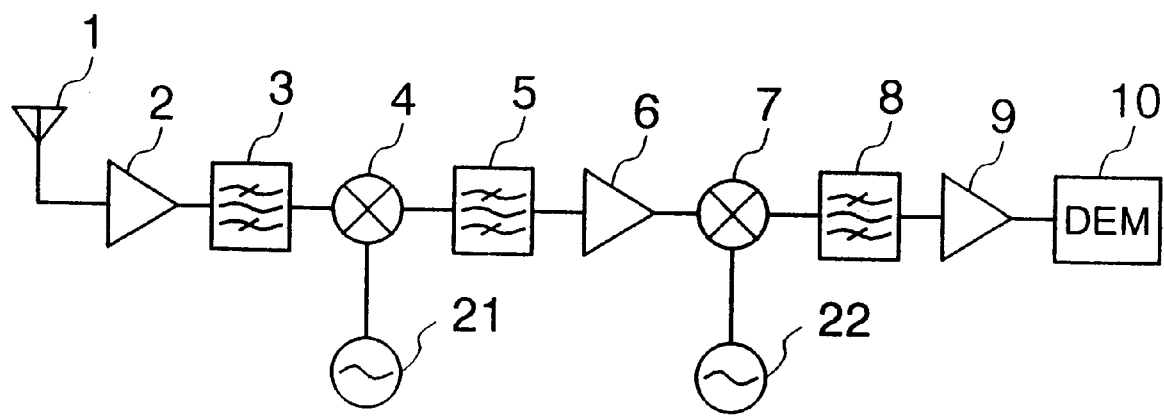
FIG. 6 is a block diagram showing a receiver circuit according to preferable embodiment.
Figure 7:
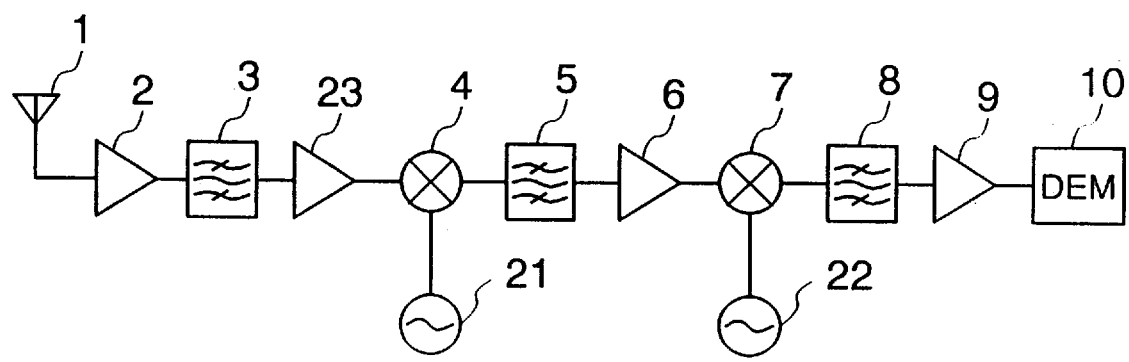
FIG. 7 is a block diagram showing a receiver circuit according to still another embodiment.

The functions of the amplifier 23 described ahead with respect to FIG. 7 is the same as that of an amplifier 6 in FIG. 6.

FIG. 6 shows a double superheterodyne receiver providing a digital radio receiver according to another embodiment. In FIG. 6, the signals received by an antenna 1 are amplified by a low-noise amplifier 2. After the undesired components are removed by a bandpass filter 3, the resultant signal is multiplied with a first local oscillation signal 21 at a mixer 4 and thus frequency-converted into a first intermediate frequency. Further, only the desired signal is selected by a narrow-bandwidth bandpass filter 5, and the resultant signal through the filter 5 is applied through an intermediate frequency amplifier 6 to a second mixer 7. The functions of the intermediate frequency amplifier 6 will be described later. The second mixer 7 frequency-converts the input signal into a second intermediate frequency by multiplying the input signal with a second local oscillation signal 22, which signal is then shaped in waveform by a roll-off filter 8, amplified by a second intermediate frequency amplifier 9 including several stages of limiter amplifiers, and demodulated by a demodulator 10.

FIG. 7 is a diagram showing a double superheterodyne receiver according to another embodiment. The signal received through an antenna 1 are amplified by a low-noise amplifier 2. After the undesired components are removed by a bandpass filter 3, the resultant signal is applied to a first mixer 4 through an amplifier 23 having the amplitude-limiting function. The signal is multiplied by a first local oscillation signal 21 and frequency-converted into a first intermediate frequency at the first mixer 4. Further, only the desired signal is selected by a narrow-bandwidth bandpass filter 5, and then the signal through the filter 5 is applied through an intermediate frequency amplifier 6 to a second mixer 7. The second mixer 7 multiplies the input signal with a second local oscillation signal 22, and thus frequency-converts the signal into a second intermediate frequency signal. After being shaped in waveform by a roll-off filter 8, the second intermediate signal is amplified by a second intermediate frequency amplifier 9 including several stages of limiter amplifiers, and demodulated by a demodulator 10.

Figure 9:
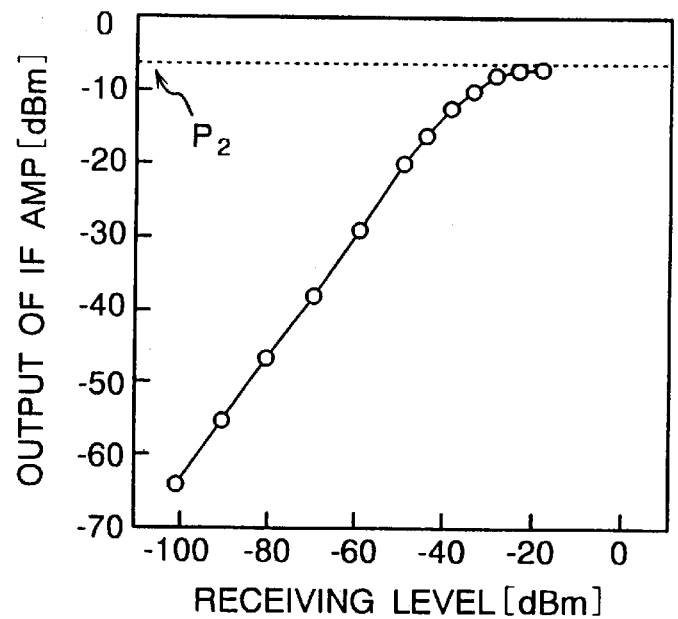
FIG. 9 shows an output characteristic of an intermediate frequency amplifier with respect to the receiving level according to the embodiment of FIG. 6.

The operation and features of the embodiment shown in FIG. 6 will be described with reference to FIGS. 9 and 11. FIG. 9 shows the output characteristic with respect to the antenna input level of an intermediate frequency amplifier 6 according to the invention, and FIG. 10 shows a bit error rate characteristic of a receiver to which the invention is applied.

Figure 4:
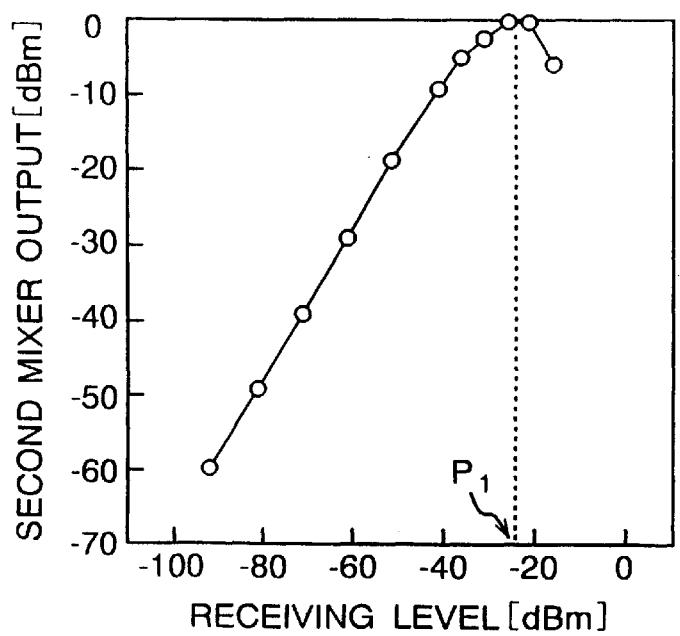
FIG. 4 shows an output characteristic of a second mixer with respect to a conventional receiving level.

The receiver shown in FIG. 6 comprises an intermediate frequency amplifier 6 exhibiting the input-output characteristics as shown in FIG. 9 in a stage before the second mixer 7. In FIG. 9, level $P_2$ represents an output level at which the intermediate frequency amplifier 6 performs the amplitude-limiting operation. In FIG. 4, the power input to the second mixer when the second mixer is saturated is expressed as $P_1+G$ where G is the overall gain up to the bandpass filter 5 from the antenna 1 in FIG. 1. In other words, the maximum output P2 of the intermediate frequency amplifier 6 is set to $P_2 \leq P_1+G$, so that even when the receiving level is high, the intermediate frequency amplifier 6 enters an amplitude-limiting operation before the second mixer 7 begins to be saturated, and provides an output only up to level $P_2$ smaller than $P_1+G$. Therefore, the deterioration of the bit error rate characteristic due to the distortion of the second mixer 7 is prevented, and the bit error rate characteristic is improved as shown in FIG. 10.

Figure 3:
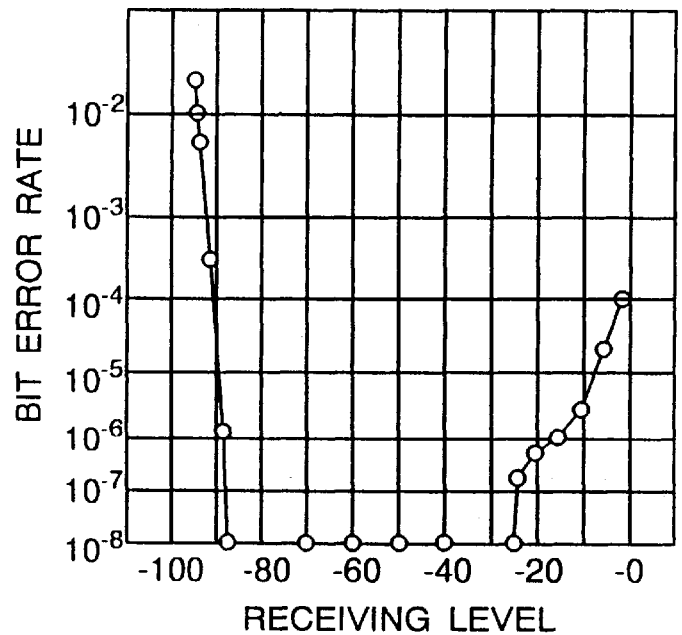
FIG. 3 is a diagram showing the bit error rate characteristic of the conventional receiver of FIG. 1.
Figure 10:
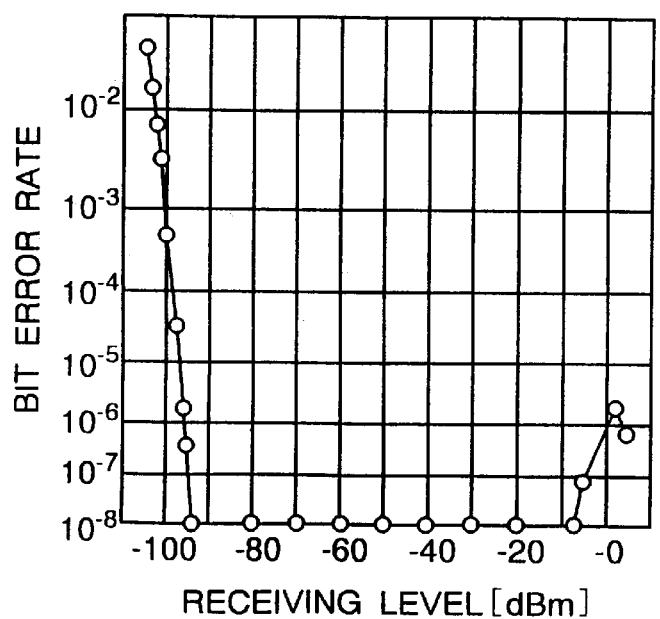
FIG. 10 shows a bit error rate characteristic of the same embodiment.

Comparison of the characteristics in FIGS. 3 and 10 at the bit error rate level of 10-6 shows that the bit error rate is −89 dBm to −15 dBm in FIG. 3, whereas the figure ranges from −96 dBm to 0 dBm in FIG. 10, indicating that the improvement is conspicuous on large input side. FIG. 10 also shows the subsidiary effect that even when the receiving level is very small, insertion of an intermediate frequency amplifier improves the gain and hence the bit error rate characteristic as a result of improvement in the signal-to-noise ratio of the receiver as a whole.

The function of the amplifier 23 in FIG. 7 is the same as that of the amplifier 6 in FIG. 6. That is, the amplifier 23 prevents the mixer 4 in FIG. 7 from saturating, thereby more improvements of bit error rate characteristics are expected than that in FIG. 11.

Figure 8:
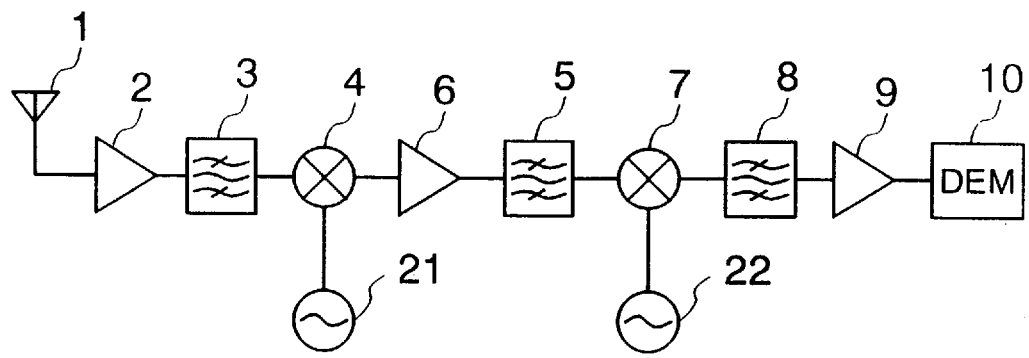
FIG. 8 is a block diagram showing a receiver circuit according to a still further embodiment.

FIG. 8 shows still another embodiment of the invention. The receiver of FIG. 8 comprises an intermediate frequency amplifier 6 in the stage of first intermediate frequency and is similar to the embodiment shown in FIG. 6. The functions of each block of the receiver shown in FIG. 8 are the same as those of the corresponding parts of the embodiment shown in FIG. 6 with the exception that the bandpass filter 5 and the intermediate frequency amplifier 6 in FIG. 6 are replaced with each other in order. Due to the insertion loss of the bandpass filter 5, however, the area of amplitude-limiting operation of the intermediate frequency amplifier 6 is required to be increased by the amount of insertion loss.

Although the embodiment under consideration deals with the amplitude limitation of the input signal to the second mixer, the same concept can of course be applied to the first mixer with equal effect, as shown in FIGS. 5 and 7. In other words, in the case where the circuit output is saturated by an excessive input, the transmission distortion of the circuit with a saturated output can be reduced for a smaller bit error rate of the radio receiver by limiting the amplitude in order to prevent the excessive input into the said circuit even before band limitation by a roll-off filter or the like. In spite of this, the amplitude limitation for the second mixer is considered most preferable in view of the construction of the radio receiver.

Now, a specific example of the intermediate frequency amplifier 6 having the amplitude-limiting function and the operation thereof will be explained.

Figure 11:
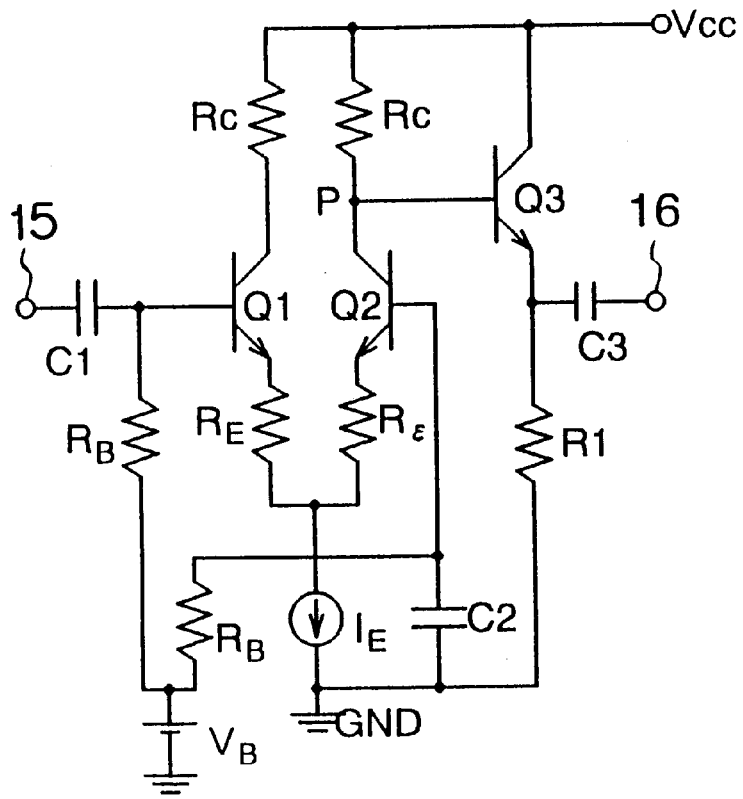
FIG. 11 is a diagram showing an example circuit of an intermediate frequency amplifier according to an embodiment.

FIG. 11 shows an embodiment using a differential circuit having an NPN transistor. Transistors Q1 and Q2 of the same shape form a pair, each collector of these transistors is connected through a resistor $R_C$ to a source voltage Vcc, and each emitter thereof is connected through a resistor $R_E$ to an end of a common constant current source $I_E$. The other end of the constant current source $I_E$ is connected to the ground GND. Also, the base of each transistor is supplied with a voltage $V_B$ through a resistor $R_B$. The base of the transistor Q1 is connected to an input terminal 15 through a capacitor C1, and the base of the transistor Q2 is grounded in high frequency by a capacitor C2. The collector of the transistor Q3 is connected to the source voltage Vcc, and the emitter thereof is connected to the ground GND through a resistor R1 on the one hand and connected to an output terminal 16 through a capacitor C3 at the same time. The base of the transistor Q3, on the other hand, is connected to the collector of the transistor Q2. The transistors Q1 and Q2, when considered independently of each other, each constitute a common-emitter amplifier circuit with a gain of about $R_C/2R_E$. The transistor Q3 makes up an emitter-follower circuit with a gain of about unity. The signal input to the base of the transistor Q1 through the capacitor C1 from the input terminal 15 is amplified by a differential circuit including the transistors Q1 and Q2, and output to the output terminal 16 from the emitter of the transistor Q3 through the capacitor C3. The operation of this circuit will be described below.

Figure 12:
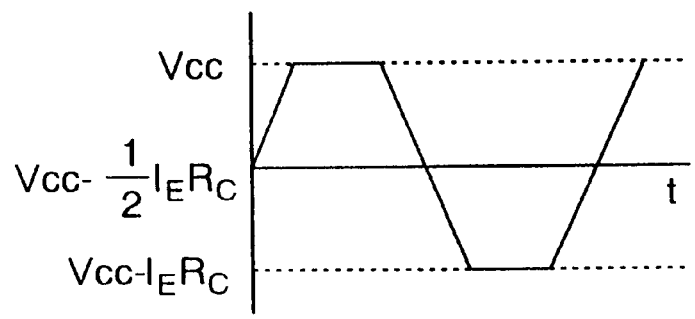
FIG. 12 shows an output voltage waveform of the intermediate frequency amplifier shown in FIG. 11.

In FIG. 11, the current flowing in the transistors Q1 and Q2 in the absence of signal input is $(½)I_E$ respectively. The potential Vp at a connecting point P constituting the collector of the transistor Q3, therefore, is $Vcc-(½)I_E \cdot R_C$. Hence, in the case where the amplitude of the signal applied to the input terminal 15 is small, the voltage waveform at the connecting point P varies in accordance with the input signal around the level of $Vcc-(½)I_E \cdot R_C$. When a signal of large amplitude is applied to the input terminal 15 and the base potential of the transistor Q1 changes considerably in positive direction, the current IE flows on transistor Q1 side. In the process, the current on transistor Q2 side becomes zero, and therefore the potential Vp at the connecting point P becomes substantially equal to Vcc. As a result, the Vp waveform with an input having a large positive amplitude has the upper part thereof limited by Vcc. In the case where the base potential of the transistor Q1 considerably changes in negative direction, on the other hand, the base-emitter circuit of the transistor Q1 is biased reversely, so that the current on transistor Q1 side becomes zero and the current $I_E$ flows on transistor Q2 side. Consequently, $Vp=Vcc-I_E \cdot R_C$. The waveform of Vp with a large negative amplitude thus has the lower part thereof limited by $Vcc-I_E \cdot R_C$. As seen from above, the voltage Vp with a high input level assumes a waveform as shown in FIG. 12. The signal is thus applied to the output terminal 16 through the transistor Q3. In this way, the amplitude-limiting operation via clipping is realized. The level of amplitude limitation, which is determined by $I_E \cdot R_C$, is set below the saturation level of the second mixer.

Figure 13:
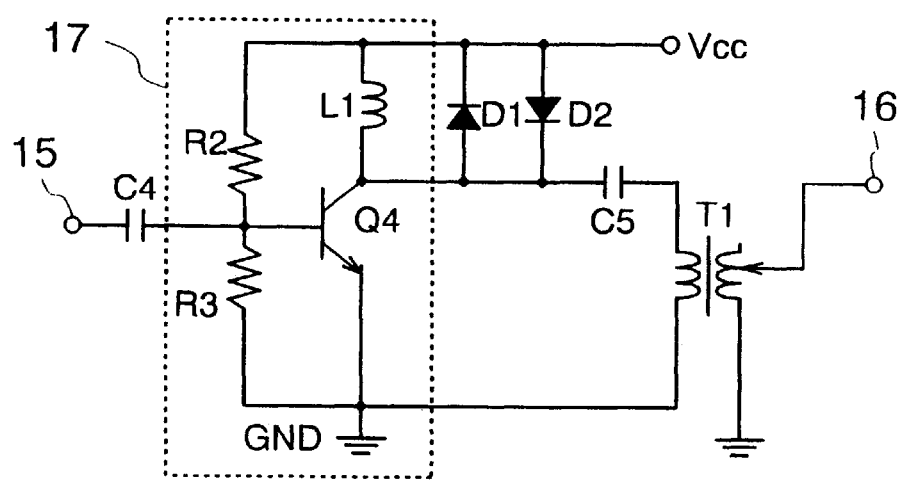
FIG. 13 is a diagram showing an example circuit of an intermediate frequency amplifier according to another embodiment.

The intermediate frequency amplifier 6 having the amplitude-limiting function according to still another embodiment may use a diode. FIG. 13 shows an example in which two diodes are connected in opposite directions in parallel to a load of a common-emitter amplifier circuit. The collector of a transistor Q4 is connected to a source voltage Vcc through an inductor L1, and the base thereof is connected to the source voltage Vcc through a resistor R2 on the one hand and connected to the ground GND through a resistor R3 on the other hand. The emitter of this transistor is connected to the ground GND. More specifically, the circuit 17 defined by dotted line is a common-emitter amplifier circuit with the operating point thereof determined by the resistors R1 and R2. The diode D1 has the anode thereof connected to the collector of the transistor Q4 and the cathode thereof connected to the source voltage Vcc. The diode D2, on the other hand, is connected in the direction opposite to the diode D1. The signal applied from the input terminal 15 is applied to the base of the transistor Q4 through the capacitor C4, amplified by the common-emitter amplifier circuit 17, and output to the output terminal 16 through the capacitor C5 and a transformer T1. The operation of this circuit will be explained below.

Figure 14A:
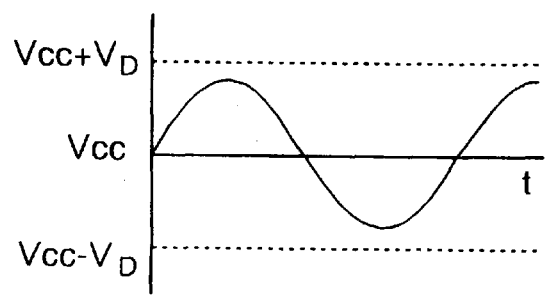
FIG. 14A is a diagram showing an output voltage waveform of an intermediate frequency amplifier not in amplitude limiting operation.
Figure 14B:
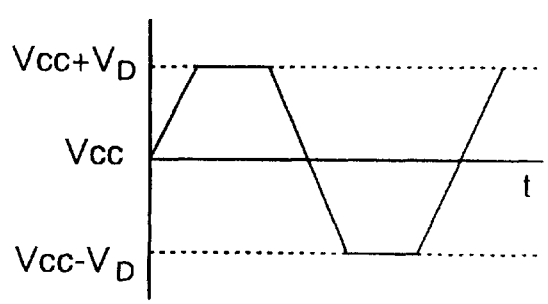
FIG. 14B is a diagram showing an output voltage waveform of an intermediate frequency amplifier in amplitude limiting operation.

When a current begins to flow sharply with the conduction of the diodes D1 and D2, the anode-cathode voltage becomes $V_D$. In the case where the input level is low and the amplitude of the output voltage waveform is lower than $V_D$, substantially no current flows in the diodes D1 and D2, so that the impedance of the diodes D1 and D2 can be considered infinitely large. As a result, the circuit of FIG. 13 operates simply as a common-emitter amplifier circuit, and the output voltage thereof assumes a waveform as shown in FIG. 14A. In the case where the input level increases to such a degree that the positive amplitude of the output voltage waveform exceeds $V_D$, on the other hand, the diode D1 turns on and the collector potential is limited substantially to $V_{CC}+V_D$. In a similar fashion, when the negative amplitude of the output voltage waveform exceeds $V_D$, the diode D2 turns on and the collector potential is limited substantially to $V_{CC}-V_D$. When the input level is high, therefore, the output voltage assumes a waveform as shown in FIG. 14B. The magnitude of amplitude to be limited is determined only by the voltage $V_D$ of the diode, and therefore the transformer T1 is regulated to set the amplitude to meet the saturation level of the second mixer. In this way, a clipping amplitude-limiting operation can be realized as illustrated in FIG. 14B.

Figure 15:
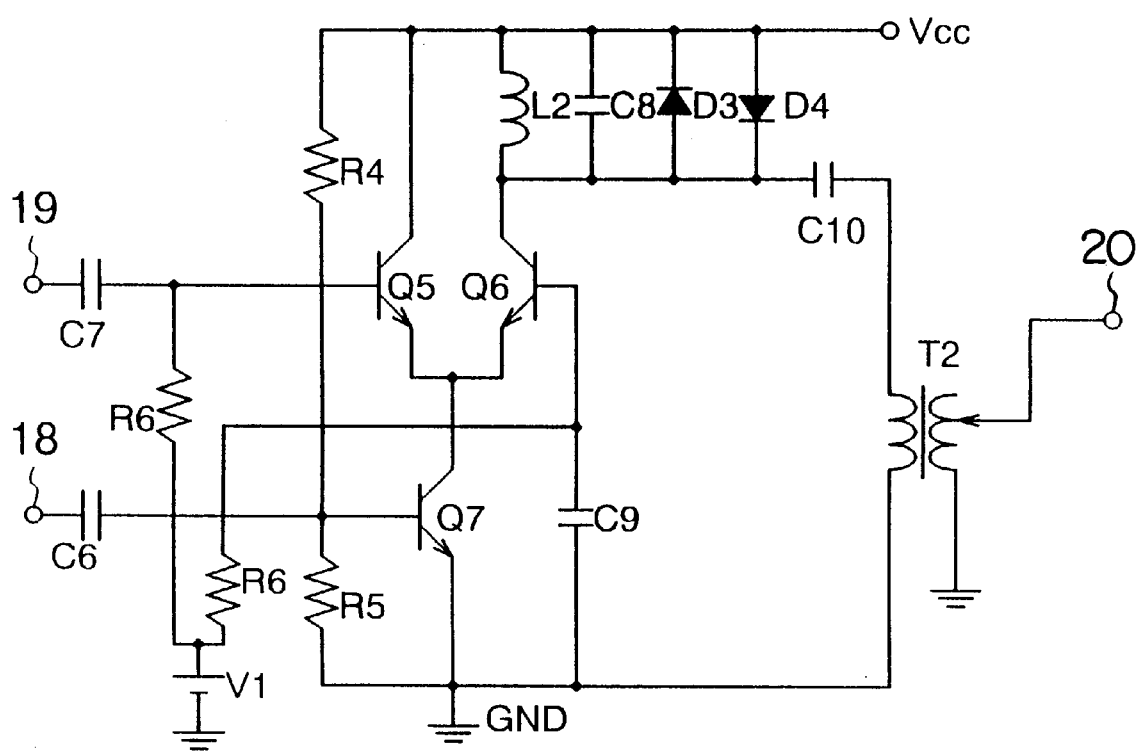
FIG. 15 shows an example circuit of a mixer having the amplitude-limiting function.

FIG. 15 shows an embodiment including a mixer having the amplitude-limiting function. The transistors Q5 and Q6 making up a differential pair each have the base thereof connected to a power supply V1 through a resistor R6. The base of the transistor Q6 is grounded through a capacitor C9, while the base of the transistor Q5 is connected to a terminal 19 through a capacitor C7. The emitters of the transistors Q5 and Q6 are connected to the collector of the transistor Q7. The collector of the transistor Q5 is connected directly to the power supply Vcc, and the collector of the transistor Q6 is connected to the power supply Vcc through an inductance L2. The inductance L2 is connected in parallel to a capacitor C8 and two diodes D3 and D4 interconnected in opposite polarities. The collector of the transistor Q6, on the other hand, is connected to the primary winding of a transformer T2 through a capacitor C10. The secondary winding of the transformer T2 has a variable tap connected to an output terminal 20. The emitter of the transistor Q7 is grounded, and the base thereof is connected to a terminal 18 through the capacitor C6 on the one one hand and to a resistor R4 with an end connected to the power supply Vcc and to a resistor R5 with an end grounded.

The operation of the embodiment shown in FIG. 15 will be explained. The transistor Q5 supplies the emitters of the transistors Q5 and Q6 with a current modulated by the first signal applied to the terminal 18. The transistors Q5 and Q6 perform the switching operation in response to the second signal applied to the terminal 19. As a result, the first and second signals and a signal having a frequency representing the sum or difference between the frequencies of the first and second signals are induced in the collector of the transistor Q6. The receiving mixer generally retrieves a signal having a difference frequency. According to this embodiment, the difference signal is retrieved by a resonator including an inductance L2 and a capacitor C8. The amplitude of this difference signal is limited by the turn-on voltage $V_D$ of the diode D3 or D4. The mixer output thus limited in amplitude is set by the transformer T2 to a level preventing the distortion of the circuits in subsequent stages and is produced from a terminal 20. The bit error rate is thus not deteriorated with the increase in the input level to the receiver as in the embodiments described above.

The intermediate frequency amplifier 6 having the amplitude-limiting function according to still another embodiment can use a circuit similar to the limiter amplifier built in the second intermediate frequency amplifier 9 of an integrated circuit (Phillip's SA626, for example) available on the market. In this case, the intermediate frequency amplifier 6, the second mixer 7 and the second intermediate frequency amplifier 9 are integrated on a single chip, thereby further reducing the size of the receiver.

Figure 1:
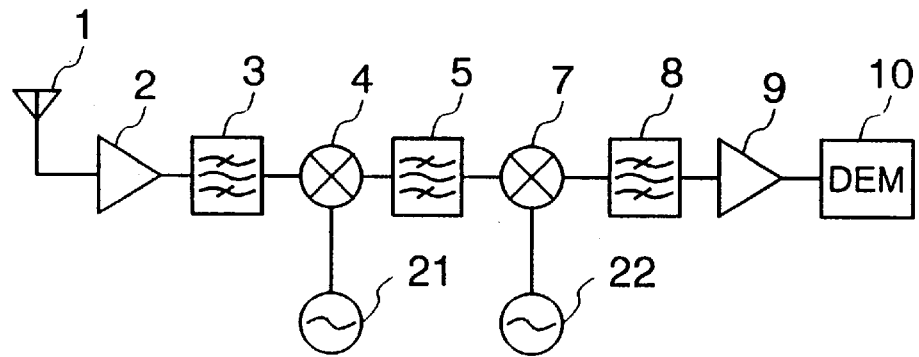
FIG. 1 is a block diagram showing a conventional receiver circuit.
Figure 2:
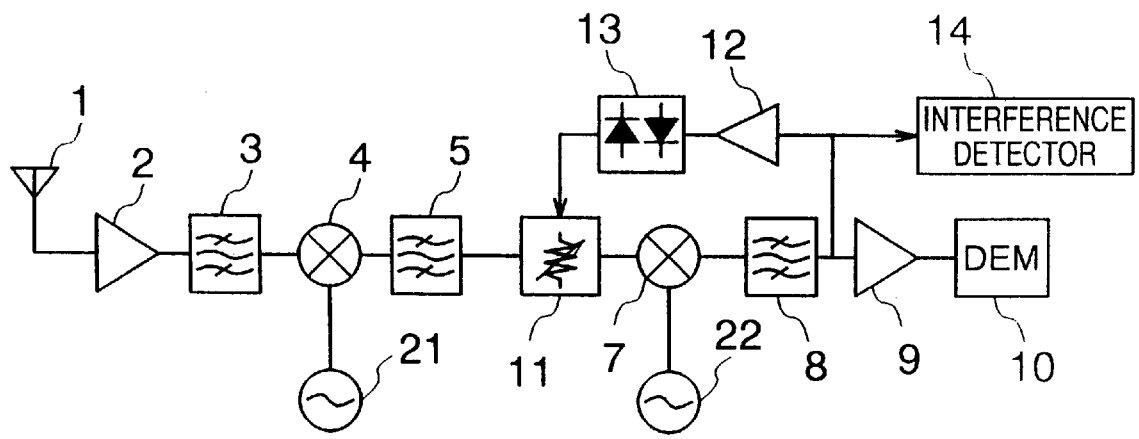
FIG. 2 is a block diagram showing another conventional receiver circuit.

As described above, the operation of the embodiment shown in FIG. 6 and the improvement of the bit error rate characteristic shown in FIG. 10 show that with a receiver according to the present invention for digital radio communications having a somewhat large level of the receiving signal, the practical bit error rate is not reduced by amplitude limitation in a circuit before a band-limiting roll-off filter. From this fact, it is obvious that the object of the invention can be achieved by attaching the amplitude-limiting function to at least one of the circuits including the low-noise amplifier 2, the first mixer 4 and the second mixer 7 in a conventional receiver, as shown in FIG. 1, in order to prevent the distortion of the second mixer 7.

An amplitude of the signal applied to the antenna is amplified in subsequent circuit and become a progressively larger. Circuits in more subsequent stages, therefore, are generally more likely to be saturated. In FIG. 1 showing a conventional circuit, the second mixer 7 is first saturated generally. With a further increase in antenna input level, the first mixer 4 is saturated, for example. In this case, the deterioration of the bit error rate characteristic can be prevented against an input of a level larger than in the embodiment of FIG. 6 by attaching the amplitude-limiting function to the low-noise amplifier 2 preventing the saturation of the first mixer 4 or to the first mixer 4 preventing the output saturation thereof.

It is thus obvious from the foregoing description that apart from the embodiments shown in FIGS. 5 to 8 representing a case using a single superheterodyne and a double superheterodyne operation, the concept of the invention can be applied with equal effect to the triple superheterodyne circuit to improve the bit error rate against an excessive input.

The embodiments described above are obviously effective for preventing an excessive input to an FM receiver using a conventional limiter amplifier.

Although the foregoing description refers to a receiver, it is obvious that the same principle can be applied with equal effect to the receiving section of a mobile radio apparatus having both a receiver and a transmitter.

The above-mentioned embodiments, in which the bit error rate of the receiver is greatly improved against an excessive input, have superior characteristics in which the transmitter and the receiver are used to be closely located to each other.

Further, the above-mentioned embodiments, which are simple in circuit configuration, have the advantage that a compact, low-cost receiver can be realized.

We claim:

1. A radio receiver comprising:

an antenna;

an input amplifier for amplifying an information input signal received through said antenna;

a mixer for converting said information input signal amplified by said input amplifier into a predetermined frequency;

a band-limiting filter for waveform-shaping said information input signal frequency-converted by said mixer;

a limiting amplifier for amplitude-limiting said information input signal shaped in a waveform by said band-limiting filter;

a demodulator for demodulating said information input signal amplitude-limited by said limiting amplifier; and an information signal waveform clipper performing clipping of information components of said information input at a level where said mixer begins to be saturated, said clipper being provided in a preceding circuit to said mixer which requires preventative clipping to prevent saturation thereof.

2. A radio receiver according to claim 1, wherein said demodulator is of delayed detection type.

3. A radio receiver according to claim 2, wherein said information input signal is a digital modulation signal, and said band-limiting filter is a roll-off filter.

4. A radio receiver comprising:

an antenna;

an input amplifier for amplifying an information input signal received through said antenna;

a first mixer for converting said information input signal received by said input amplifier into a first frequency;

an intermediate frequency amplifier for amplifying said information input signal frequency-converted by said first mixer;

a second mixer for converting said information input signal amplified by said intermediate frequency amplifier into a second frequency;

a band-limiting filter for shaping a waveform of said information input signal frequency-converted by said second mixer;

an information signal waveform clipper in a form of clipping amplifier for amplitude-clipping information components of said information input signal shaped in waveform by said band-limiting filter; and a demodulator for demodulating said information input signal amplitude clipped by said clipper;

wherein said intermediate frequency amplifier has a limiting function which carries out a linear amplification until said second mixer begins to be saturated so as not to output amplification output exceeding a level by which said second mixer is saturated.

5. A radio receiver according to claim 4, wherein another information signal waveform clipper is incorporated also in a preceding circuit to a second circuit which generates a distortion by saturation next to a first circuit.

6. A radio receiver according to claim 5, wherein said demodulator is of delayed detection type.

7. A radio receiver according to claim 6, wherein said information input signal is a digital modulation signal, and said band-limiting filter is a roll-off filter.

8. A radio receiver according to claim 4, wherein said demodulator is of delayed detection type.

9. A radio receiver according to claim 8, wherein said information input signal is a digital modulation signal, and said band-limiting filter is a roll-off filter.

10. A radio receiver according to any of claims 1, 4 and 5, wherein said information signal waveform clipper is incorporated as part of said preceding circuit requiring preventative clipping to prevent saturation thereof.

11. A radio receiver according to claim 10, wherein said demodulator is of delayed detection type.

12. A radio receiver according to claim 11, wherein said information input signal is a digital modulation signal, and said band-limiting filter is a roll-off filter.

* * * * *